(12) United States Patent
Odawara

(10) Patent No.: US 11,508,879 B2
(45) Date of Patent: Nov. 22, 2022

(54) SEMICONDUCTOR DEVICE AND MANUFACTURING METHOD THEREFOR

(71) Applicant: STANLEY ELECTRIC CO., LTD., Tokyo (JP)

(72) Inventor: Masaki Odawara, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 132 days.

(21) Appl. No.: 16/899,100

(22) Filed: Jun. 11, 2020

(65) Prior Publication Data

US 2020/0403125 A1 Dec. 24, 2020

(30) Foreign Application Priority Data

Jun. 21, 2019 (JP) .............................. JP2019-115549

(51) Int. Cl.
| | |
|---|---|
| *H01L 33/48* | (2010.01) |
| *H01L 33/00* | (2010.01) |
| *H01L 33/36* | (2010.01) |
| *H01L 33/54* | (2010.01) |
| *H01L 33/62* | (2010.01) |
| *H01L 33/52* | (2010.01) |
| *H01L 33/56* | (2010.01) |

(52) U.S. Cl.
CPC ........ *H01L 33/486* (2013.01); *H01L 33/0095* (2013.01); *H01L 33/36* (2013.01); *H01L 33/54* (2013.01); *H01L 33/56* (2013.01); *H01L 33/62* (2013.01); *H01L 2933/005* (2013.01); *H01L 2933/0016* (2013.01); *H01L 2933/0066* (2013.01)

(58) Field of Classification Search
CPC ....... H01L 33/486; H01L 33/62; H01L 33/36; H01L 2933/0016
See application file for complete search history.

(56) References Cited

U.S. PATENT DOCUMENTS 7,126,159 B2 10/2006 Itai et al.

FOREIGN PATENT DOCUMENTS

| FJ | 103579477 A | * | 2/2014 | .......... | H01L 33/382 |
|---|---|---|---|---|---|
| JP | 2003-258313 A | | 9/2003 | | |

\* cited by examiner

*Primary Examiner* — Marcos D. Pizarro
*Assistant Examiner* — Antonio B Crite
(74) *Attorney, Agent, or Firm* — Kenealy Vaidya LLP

(57) ABSTRACT

A small-sized semiconductor device with a structure for stopping and keeping uncured resin or adhesive in a desired region, which is manufactured by employing a process of curing uncured resin or adhesive that is made to wet and spread on a board, is provided. The semiconductor device includes a board mounted with a semiconductor element and includes metal patterns formed on the board. The metal patterns include a first metal pattern, a second metal pattern, and a through electrode. The first metal pattern and the second metal pattern are provided separately from each other on the board. The through electrode is disposed between the first metal pattern and the second metal pattern and penetrates through the board in the thickness direction.

13 Claims, 10 Drawing Sheets

A-A' SECTIONAL VIEW

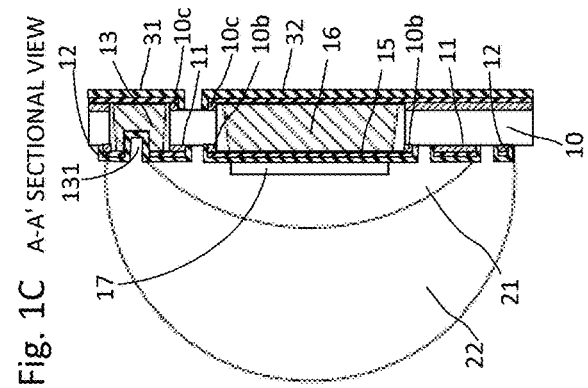
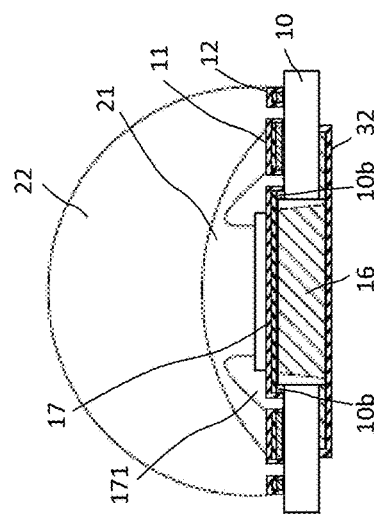
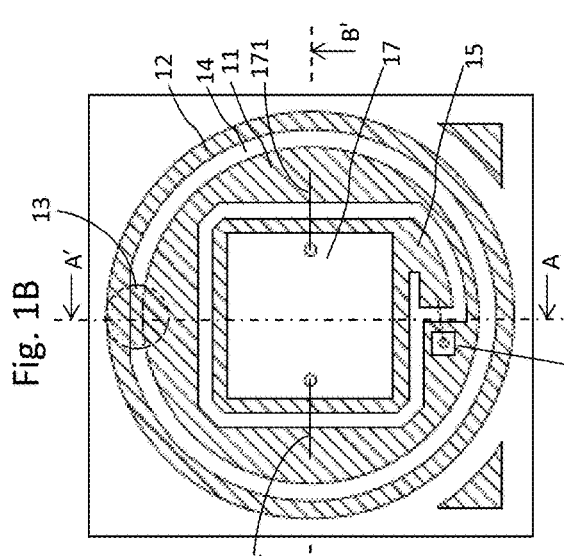
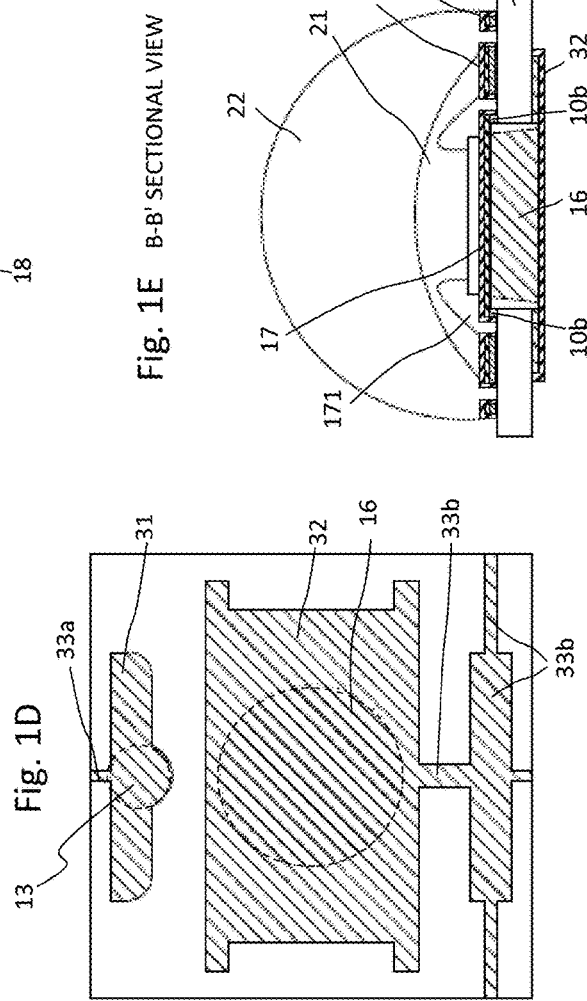
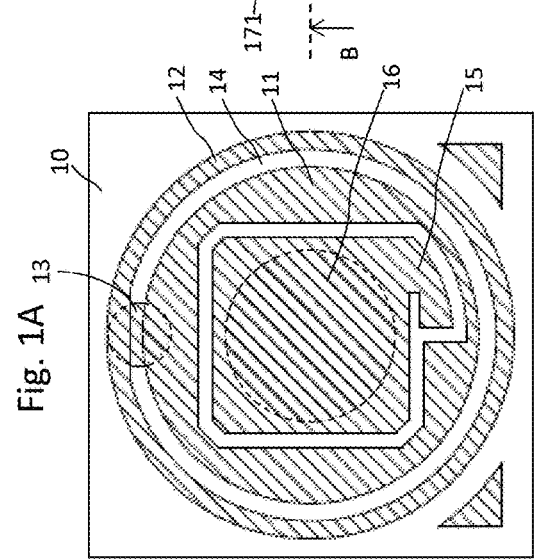

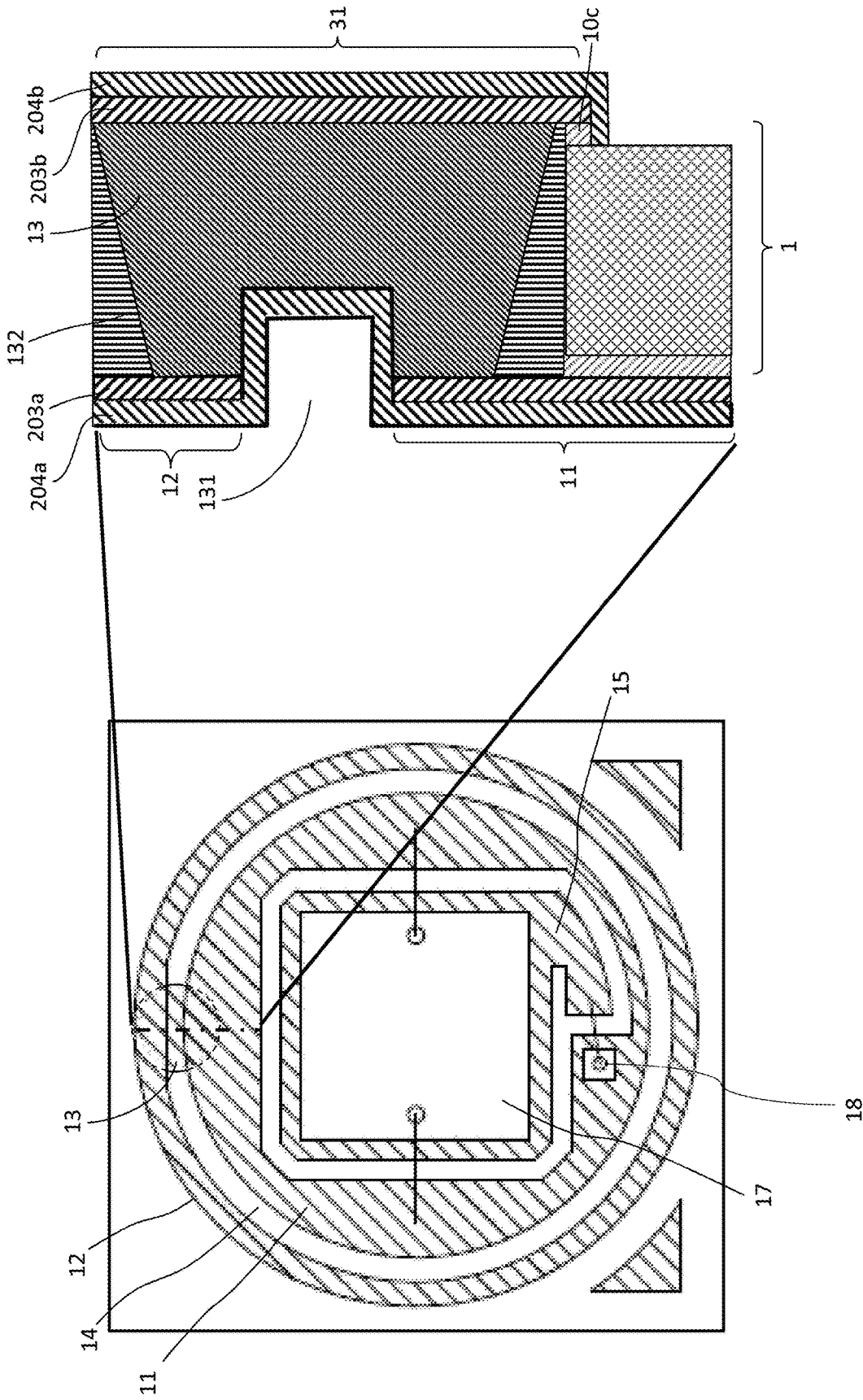

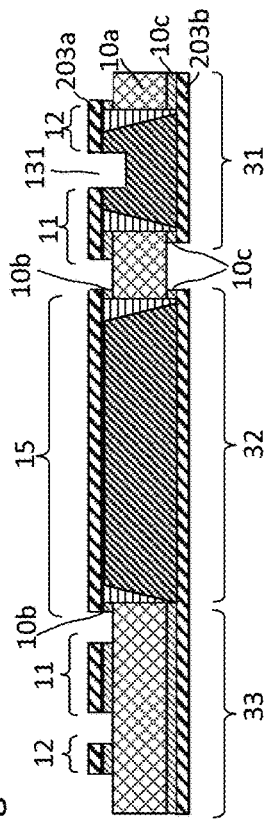
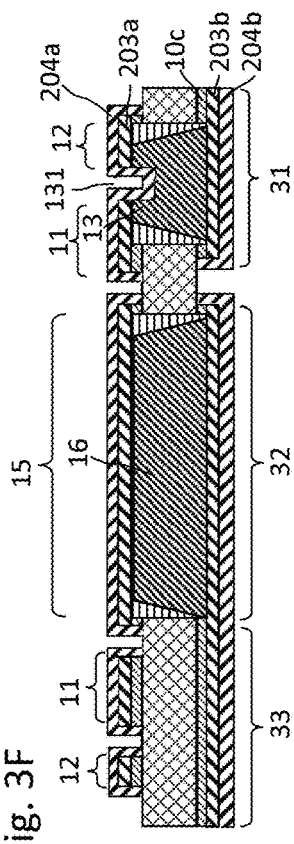
Fig. 3E
Fig. 3F
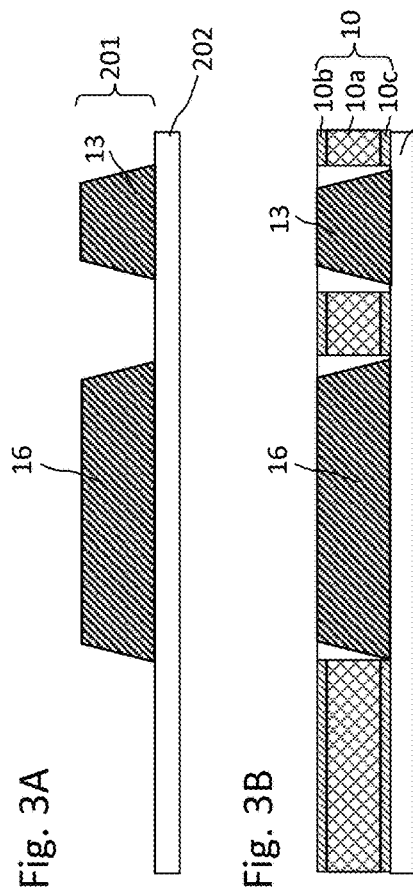
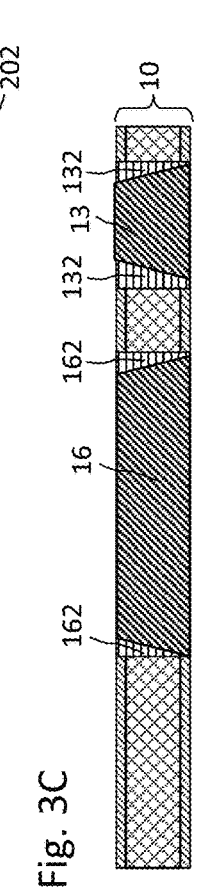
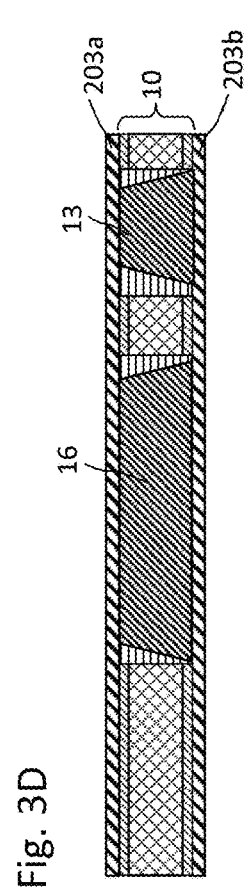
Fig. 3A
Fig. 3B
Fig. 3C
Fig. 3D

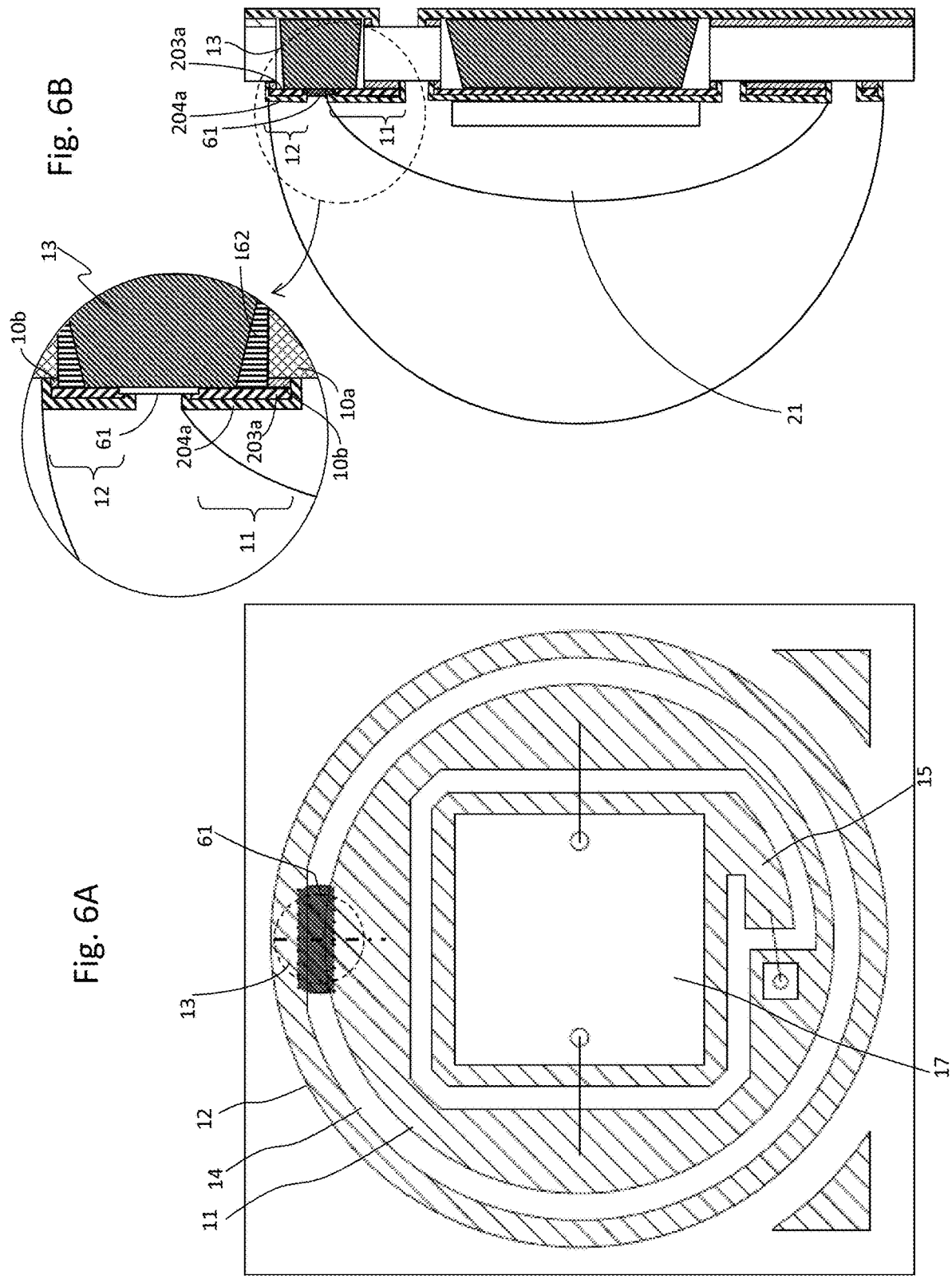

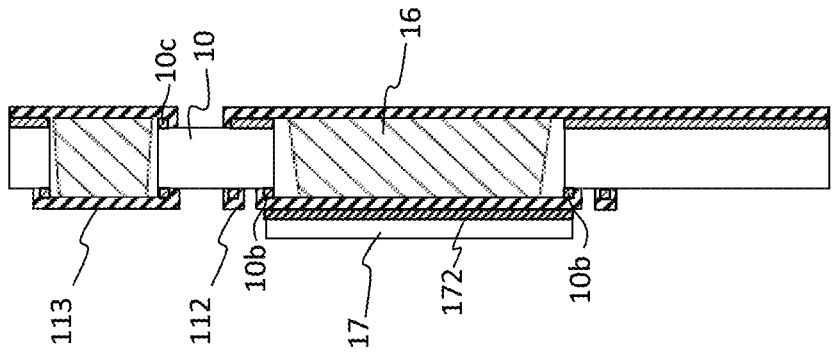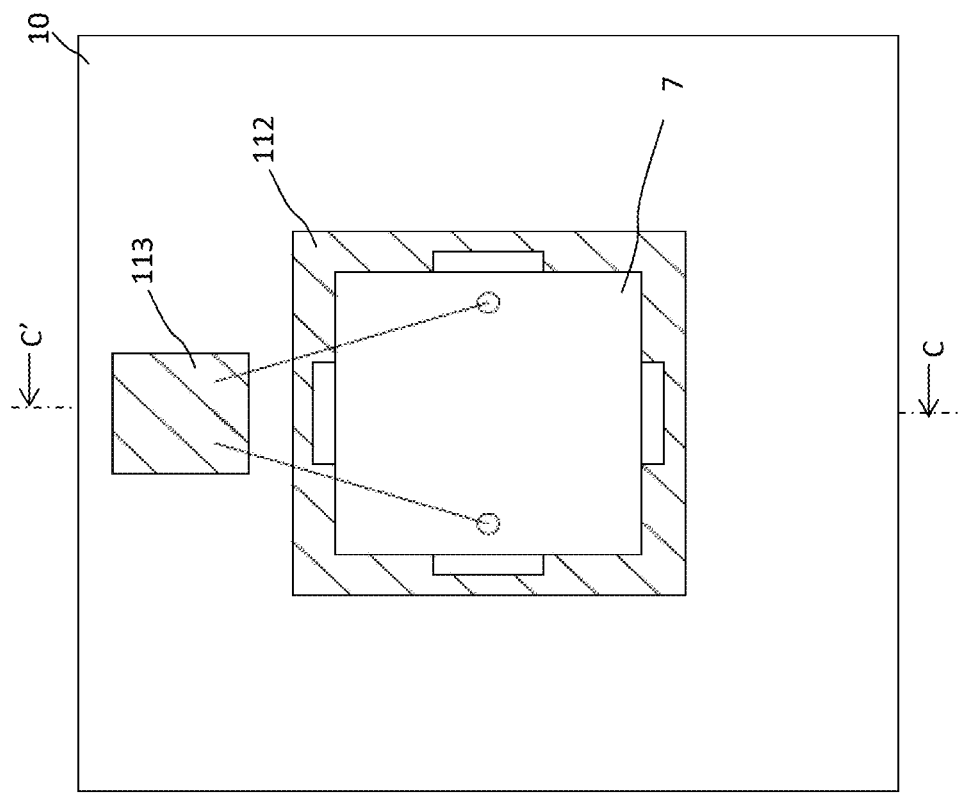

SEMICONDUCTOR DEVICE AND MANUFACTURING METHOD THEREFOR

BACKGROUND OF THE INVENTION

Field of the Invention

The present invention relates to a semiconductor device having a board that is mounted with a semiconductor element, such as a light emitting element. In particular, the present invention relates to a semiconductor device that is manufactured by employing a process of curing sealing resin or die-attaching agent that wets and spreads in an uncured state on a board.

Background Art

LED packages having a light emitting element (LED) that is mounted on a board while being enclosed by sealing resin are publicly known. For example, a package having a sealed LED is disclosed in JP-A-2003-258313. This LED is mounted on a flat board and is sealed with cured resin. The resin is cured in the condition in which the resin in an uncured state is hemispherically raised by its own surface tension and this shape is maintained, after the resin in the uncured state is dropped from above the LED.

Such an LED package is provided with a ring-shaped metal pattern around the LED in order to prevent the uncured resin from wetting and spreading to an unintended region on the board. In this structure, surface tension of the uncured resin at a step of an edge of the metal pattern prevents the resin from wetting and spreading outwardly from the metal pattern.

In particular, an LED package using a blue LED has soft silicone resin and hard silicone resin in a two-layered structure as sealing resins. The soft silicone resin that is disposed inner side of the two-layered structure makes the sealing resins hardly cause cracks, and the hard silicone resin that is disposed outer side of the two-layered structure suppresses deformation of the soft silicone resin. This prolongs the service lifetime of the blue LED package.

To form a two-layered structure of sealing resins, it is necessary to concentrically provide two ring-shaped metal patterns for limiting wetting and spreading of the sealing resins.

SUMMARY OF THE INVENTION

In the case of forming a two-layered structure of sealing resins, for example, metal patterns 101 and 102 are formed in a double ring shape, as illustrated in FIGS. 10A and 10B. A step between a circumferential edge of the metal pattern 101 and a board 104 prevents one of the two kinds of resins from wetting and spreading outwardly from the metal pattern 101, and a step between a circumferential edge of the metal pattern 102 and the board 104 prevents the other resin from wetting and spreading outwardly from the metal pattern 102. For this purpose, the metal patterns 101 and 102 are required to have such thick film thicknesses as to generate step differences that stop and keep resins. In view of this, in general, the metal patterns 101 and 102 are formed by electroplating that can form thick films.

Specifically, the ring shaped metal patterns 101 and 102 are formed by electroplating as follows. A thin metal film is formed by other method first, and this film is machined so as to have the shapes of the ring-shaped metal patterns 101 and 102. Thereafter, the board 104 is immersed in electrolyte, and electric current is supplied to the ring-shaped metal patterns 101 and 102, whereby metal in the electrolyte is deposited on the surfaces of the metal patterns 101 and 102. This requires wirings for supplying electric current to the ring-shaped metal patterns 101 and 102.

In one example, it is possible to dispose a power supplying wiring 103 on a surface of a board 104, as illustrated in FIG. 10A. The power supplying wiring 103 extends to an end of the board 104 and enables plating on metal patterns 101 and 102 together with metal patterns of a board 104 for a semiconductor device that is adjacently arranged in a multiple-piece board in a manufacturing process.

However, there is no step at a part at which the ring-shaped metal pattern 101 and the power supplying wiring 103 are coupled to each other, and therefore, uncured resin can flow out from the coupled part to the power supplying wiring 103.

In another example, it is also possible to provide an electrode or a via 105 that penetrates through a board 104 in the thickness direction, immediately under a ring-shaped metal pattern 101, as illustrated in FIG. 10B. The ring-shaped metal pattern 101 is supplied with electric current from a back surface side of the board 104 through the via 105. However, as illustrated in FIG. 10B, it is necessary to make the width of the ring-shaped metal pattern 101 greater than the diameter of the via 105. This increases the occupied area of the ring-shaped metal pattern 101 and prevents reduction in dimensions of an LED package. Specifically, for example, assuming that a practical minimum diameter of the via 105 is 0.1 mm, the ring-shaped metal pattern 101 that is disposed immediately under the via 105 is required to have a width of 0.3 mm or greater in consideration of a design tolerance of approximately 0.2 mm. Moreover, in the case in which the via diameter is 0.1 mm, it is necessary to set the thickness of the board 104 to 0.1 mm or less in order to form the via 105, and the thickness of the board 104 is limited.

On the other hand, it is also possible to form double-ring-shaped metal patterns by half etching, that is, by etching a thick metal layer formed on the entirety of a board, to the middle in the thickness direction of the metal layer. In order to control the half etching, the thickness of the metal pattern, such as a copper pattern, is required to be thick, e.g., 70 μm or greater, and therefore, film deposition takes a long time. In addition, to etch a thick copper pattern, it is necessary to make a large space width between the inner side ring-shaped metal pattern and the outer side ring-shaped metal pattern. Moreover, the half etching has problems such as difficulty in reliably providing a constant pattern size.

Such problems occur not only in a ring-shaped metal pattern for controlling wetting and spreading of sealing resin but in a case of adjacently arranging metal patterns in a specific region on a board for various purposes. For example, such problems also occur in a structure for controlling die-attaching agent or solder, which is used in fixing an LED on a metal pattern on a board, so as not to wet and spread outwardly from a desired region.

An object of the present invention is to provide a small-sized semiconductor device having multiple metal patterns with a small space therebetween in a specific region on a board. In particular, an object of the present invention is to provide a small-sized semiconductor device with a structure for stopping and keeping uncured resin or adhesive in a desired region, which is manufactured by employing a process of curing uncured resin or adhesive that wets and spreads on a board.

To achieve the above object, a semiconductor device of the present invention includes a board mounted with a semiconductor element and includes metal patterns formed on the board. The metal patterns include a first metal pattern, a second metal pattern, and a through electrode. The first metal pattern and the second metal pattern are provided separately from each other on the board. The through electrode is disposed between the first metal pattern and the second metal pattern and penetrates through the board in the thickness direction. The first metal pattern and the second metal pattern are at least partially in contact with an upper surface of the through electrode. A continuous plating layer may be disposed on the first metal pattern, the second metal pattern, and the through electrode. The first metal pattern, the second metal pattern, and the through electrode may be in electric contact with each other by the plating layer.

The present invention enables forming the first metal pattern and the second metal pattern by performing plating such that electric current is supplied from a back surface side of the board to both of the first metal pattern and the second metal pattern via the through electrode. Thus, a structure for stopping and keeping uncured resin or adhesive in a desired region is formed by plating, and a small-sized semiconductor device is provided.

BRIEF DESCRIPTION OF THE DRAWINGS

FIG. 1A is a top view of a board of a semiconductor device of Embodiment 1, FIG. 1B is a top view of the whole semiconductor device, FIG. 1C is an A-A' sectional view of the semiconductor device, FIG. 1D is a bottom view of the semiconductor device, and FIG. 1E is a B-B' sectional view of the semiconductor device.

FIG. 2A is a top view of the semiconductor device of Embodiment 1, and FIG. 2B is an enlarged sectional view in the vicinity of a through electrode 13.

FIGS. 3A to 3F are sectional views illustrating a process of manufacturing the semiconductor device of Embodiment 1.

FIG. 6A is a top view of a semiconductor device of Embodiment 3, and FIG. 6B is an enlarged sectional view in the vicinity of a through electrode 13.

FIG. 8A is a top view of a semiconductor device of a comparative example of Embodiment 4, and FIG. 8B is a sectional view of this semiconductor device.

DETAILED DESCRIPTION OF THE INVENTION

Figure 4A:
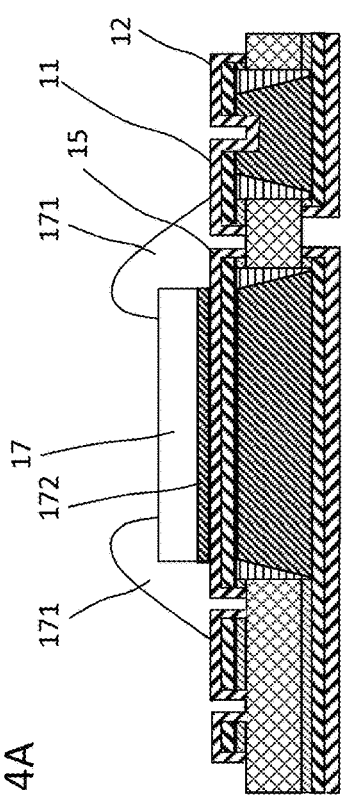
FIGS. 4A to 4C are sectional views illustrating a process of manufacturing the semiconductor device of Embodiment 1.

Semiconductor devices of embodiments of the present invention will be described with reference to the drawings.

Embodiment 1

A semiconductor device of Embodiment 1 will be described with reference to FIGS. 1A to 1E and other drawings. FIG. 1A is a top view of a board of the semiconductor device of Embodiment 1, FIG. 1B is a top view of the whole semiconductor device, FIG. 1C is an A-A' sectional view of the semiconductor device, FIG. 1D is a bottom view of the semiconductor device, and FIG. 1E is a B-B' sectional view of the semiconductor device.

As illustrated in FIGS. 1A to 1E, the semiconductor device of Embodiment 1 includes a board 10 mounted with a semiconductor element 17, metal patterns 11, 12, and 15 formed on the board 10, and a first sealing resin 21 and a second sealing resin 22 for double sealing of the semiconductor element 17.

The semiconductor element 17 is fixed on an element mounting metal pattern 15 that is disposed at the center among the metal patterns 11, 12, and 15. Herein, the semiconductor element 17 is a light emitting element and includes an upper surface electrode and a back surface electrode that have different polarities from each other, and the back surface electrode is fixed to the element mounting metal pattern 15 by solder bonding or other joining method.

The metal pattern 11, which is hereinafter also called a first metal pattern, is arranged so as to enclose the element mounting metal pattern 15. The metal pattern 12, which is hereinafter also called a second metal pattern, is arranged so as to enclose the metal pattern 11. The outer circumferential edge of the metal pattern 11 is circular, and the metal pattern 12 has an approximately ring shape. The outer circumferential edge of the metal pattern 11 and the inner circumferential edge and the outer circumferential edge of the metal pattern 12 exhibit approximately concentric shapes.

The outer circumferential edge of the first metal pattern 11 and the inner circumferential edge of the second metal pattern 12 are separated from each other by a region 14 at which the surface of the board 10 is exposed. The surface of the board 10 is also exposed at a part outside the second metal pattern 12.

Thus, a step is formed between the outer circumferential edge of the first metal pattern 11 and the upper surface of the board 10 by the thickness of the first metal pattern 11. When uncured first sealing resin 21 is made to wet and spread in a manufacturing process, the first sealing resin 21 is stopped and kept by surface tension upon reaching this step and does not extend outwardly from the first metal pattern 11. As a result, the first sealing resin 21 seals the semiconductor element 17 in the region inside the outer circumferential edge of the first metal pattern 11, as illustrated in FIGS. 1C and 1E.

Also, a step is formed between the outer circumferential edge of the second metal pattern 12 and the upper surface of the board 10 by the thickness of the second metal pattern 12. Thus, when uncured second sealing resin 22 is made to wet and spread in a manufacturing process, the second sealing resin 22 is stopped and kept by surface tension upon reaching this step and does not extend outwardly from the second metal pattern 12. As a result, the second sealing resin 22 seals the first sealing resin 21 and the semiconductor element 17 in the region inside the outer circumferential edge of the second metal pattern 12, as illustrated in FIGS. 1C and 1E.

That is, the outer circumferential edge of each of the first metal pattern 11 and the second metal pattern 12 functions as what is called a resin dam for stopping and keeping uncured resin.

A through electrode 13 that penetrates through the board 10 in the thickness direction is disposed at a part of the region 14 between the first metal pattern 11 and the second metal pattern 12. The through electrode 13 is disposed in such a manner as to cross the first metal pattern 11 and the second metal pattern 12, and the first metal pattern 11 and the second metal pattern 12 are partially in contact with an upper surface of the through electrode 13.

FIG. 2A is an enlarged view of the upper surface of the semiconductor device, and FIG. 2B is an enlarged sectional view in the vicinity of the through electrode 13. As illustrated in FIG. 2B, a continuous plating layer 204a is disposed on the first metal pattern 11, the second metal pattern 12, and the through electrode 13 to electrically connect them to each other.

Such disposition of the through electrode 13 in such a manner as to cross the first metal pattern 11 and the second metal pattern 12 enables supplying electric current from a back surface of the board 10 to the first metal pattern 11 and the second metal pattern 12 via the through electrode 13. Thus, it is possible to increase the film thickness by performing electroplating in such a manner that the plating layer 204a is deposited on the surfaces of the first metal pattern 11 and the second metal pattern 12. This allows forming the first metal pattern 11 and the second metal pattern 12 that have such large thicknesses as to form a step that functions as a resin dam at a boundary relative to the board 10.

Disposition of the through electrode 13 in such a manner as to cross the first metal pattern 11 and the second metal pattern 12 enables narrowing the ring widths of the first metal pattern 11 and the second metal pattern 12 more than the diameter of the through electrode 13. That is, it is possible to narrow the ring widths of the first metal pattern 11 and the second metal pattern 12 more than a minimum diameter that allows forming the through electrode 13, whereby the occupied areas of the first metal pattern 11 and the second metal pattern 12 can be small. This structure thus can provide a small-sized semiconductor device.

The through electrode 13 is provided with a groove 131 in a region between the first metal pattern 11 and the second metal pattern 12. Thus, the outer circumferential edge of the first metal pattern 11 has a step due to the groove 131 and thereby functions as a resin dam, also in the region in which the through electrode 13 is disposed. As a result, the first metal pattern 11 prevents uncured first sealing resin 21 from flowing out and raises the first sealing resin 21 in a dome shape also at the position of the through electrode 13. The plating layer 204a also covers an inner wall of the groove 131.

The width of the groove 131, which is the space between the first metal pattern 11 and the second metal pattern 12 on the through electrode 13, is designed to be narrower than the space between the first metal pattern 11 and the second metal pattern 12 in a region in which the through electrode 13 is not disposed, as illustrated in FIGS. 1A, 1B, and 2A. This structure controls so that the depth of the groove 131 will not become too large in a manufacturing process, which will be described later.

The board 10 includes a second through electrode 16 under the element mounting metal pattern 15. The upper surface electrode of the semiconductor element 17 is coupled to the first metal pattern 11 by two bonding wires 171.

A back surface electrode 31 that is disposed at the position of the through electrode 13, a back surface electrode 32 that is disposed at the position of the through electrode 16, and wirings 33a and 33b respectively coupled to the back surface electrodes 31 and 32, are provided on the back surface side of the board 10.

In these conditions, the upper surface electrode of the semiconductor element 17 is electrically connected to the bonding wires 171, the first metal pattern 11, the through electrode 13, the back surface electrode 33, and the wiring 33a. On the other hand, a back surface electrode of the semiconductor element 17 is electrically connected to the element mounting metal pattern 15, the through electrode 16, the back surface electrode 32, and the wiring 33b. Thus, the semiconductor element 17 is supplied with electric current via the through electrodes 13 and 16, the first metal pattern 11, and other parts and is thereby made to emit light, by supplying electric current between the wirings 33a and 33b on the back surface of the board 10. The emitted light passes through the first sealing resin 21 and the second sealing resin 22 and exits to the outside.

The first sealing resin 21 and the second sealing resin 22 seal the semiconductor element 17 to protect it from moisture and impacts.

<Manufacturing Method>

A method for manufacturing the semiconductor device of Embodiment 1 will be described with reference to FIGS. 3A to 4C.

The following describes a process of manufacturing one semiconductor device on a board 10 for easiness of explanation, but a board 10 that allows obtaining multiple pieces therefrom may be prepared in order to manufacture multiple semiconductor devices.

As illustrated in FIG. 3A, a copper sheet 201 having a thickness equal to the thickness of a board 10, for example, a thickness of approximately 100 to 400 µm, is prepared, a support layer 202 is affixed to the back surface, and the copper sheet 201 is then etched into the shapes of through electrodes 13 and 16. The copper sheet 201 is made of rolled bulk copper.

As illustrated in FIG. 3B, a board 10 with Cu foils 10b and 10c affixed to both surfaces of an insulation layer 10a is prepared, and a through hole is provided at each of the positions for the through electrodes 13 and 16. Herein, the insulation layer 10a is a resin layer. The board 10 is covered on the support layer 202 of the through electrodes 13 and 16 in such a manner that the through electrode 13 is inserted into the through hole.

As illustrated in FIG. 3C, a resin 132 is injected into a space between the through hole and the through electrode 13, whereas a resin 162 is injected into a space between the through hole and the through electrode 16, and these resins 132 and 162 are cured. As necessary, the through electrodes 13 and 16 protruding from the surface of the board 10 are removed by, e.g., polishing, whereby the surface of the board 10 is made flat. The support layer 202 of the through electrodes 13 and 16 is removed.

As illustrated in FIG. 3D, after Cu plating layers 203a and 203b are formed on the entirety of both surfaces of the board 10 by electroless plating, the formed Cu plating layers 203a and 203b are supplied with electric current and are grown to have a thick thickness of, for example, approximately 15 to 100 µm, by electroplating.

As illustrated in FIG. 3E, etching is performed to remove the Cu plating layers 203a and 203b and the Cu foils 10b and 10c in regions except for regions for an element mounting metal pattern 15, a first metal pattern 11, and a second metal pattern 12 on the upper surface of the board 10 and regions for back surface electrodes 31 and 32 and wirings 33a and 33b on the back surface of the board 10. At this time, a groove 131 is formed between the first metal pattern 11 and the second metal pattern 12 on the through electrode 13 is formed. In the etching process, slight over-etching is performed in such a manner that the Cu plating layers 203a and 203b and the Cu foils 10b and 10c are reliably removed to expose the surface of the glass epoxy board 10a in the etched regions, in order to generate patterns of the element mounting metal pattern 15, the back surface electrodes 31 and 32, and the wirings 33a and 33b. As a result, the surface of the through electrode 13 is partially etched, and the through electrode 13 is exposed at the inner wall of the groove 131.

The through electrode 13 is not limited to one made of bulk copper as in this embodiment and can be one that is filled with plating copper. However, using bulk copper allows easy control of the amount of etching because the etching speed of bulk copper is lower than that of plating copper, whereby a highly reliable semiconductor device is provided.

The width of the groove 131 is designed to be narrower than the space between the first metal pattern 11 and the second metal pattern 12 in the region in which the through electrode 13 is not disposed. This makes it easy to set the etching time in such a manner that the depth of the groove 131 does not become too large but the insulation layer 10a of the board 10 is exposed in the region 14 between the first metal pattern 11 and the second metal pattern 12 in the region in which the through electrode 13 is not disposed.

As illustrated in FIG. 3F, plating layers 204a and 204b are formed on both surfaces by successively forming a Ni layer with a thickness of, for example, approximately 3 to 15 µm, and a Au layer with a thickness of, for example, approximately 0.05 to 0.3 µm, by electroplating. The electroplating is performed by supplying electric current to the first metal pattern 11, the second metal pattern 12, and the Cu plating layer 203a of the element mounting metal pattern 15 via the wirings 33a and 33b, the back surface electrodes 31 and 32, and the through electrodes 13 and 16 on the back surface of the board 10. The plating layer 204a is formed continuously on the first metal pattern 11, the second metal pattern 12, and a top of the through electrode 13, at the upper part of the through electrode 13, thereby electrically connecting them to each other.

Next, as illustrated in FIG. 4A, a semiconductor element 17 is mounted on the element mounting metal pattern 15, and a back surface electrode of the semiconductor element 17 is bonded to the element mounting metal pattern 15 by a solder layer 172. In addition, an upper surface electrode of the semiconductor element 17 is coupled to the first metal pattern 11 by bonding wires 171.

Figure 4B:
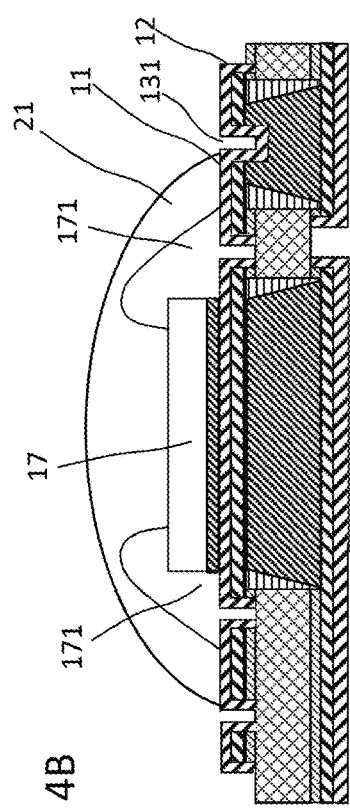

As illustrated in FIG. 4B, uncured first sealing resin 21, which is a silicone resin that becomes soft after being cured, is dropped on the semiconductor element 17 in order to perform potting. After the uncured first sealing resin 21 wets and spreads, the uncured first sealing resin 21 is stopped and kept by surface tensions generated at a step between the first metal pattern 11 and the board 10 and at a step between the first metal pattern 11 and the groove 131 at the outer circumferential edge of the first metal pattern 11 and becomes a dome shape. In this state, the first sealing resin 21 is cured.

Figure 4C:
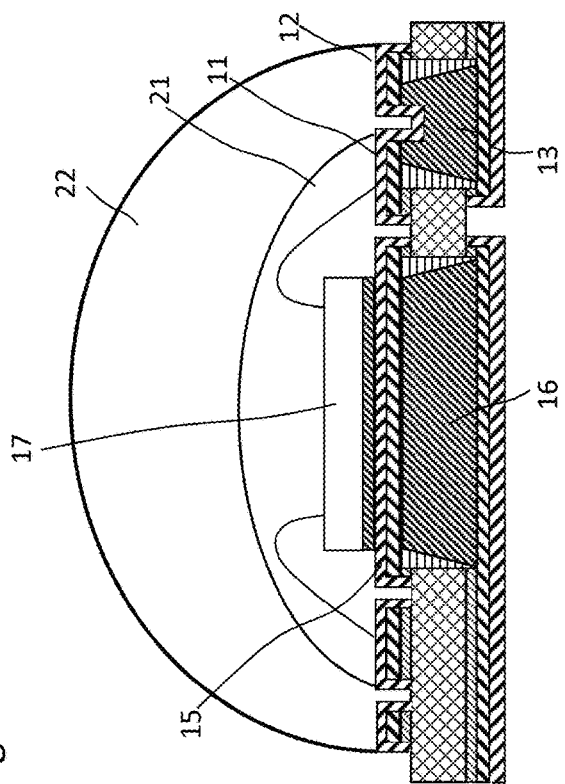

As illustrated in FIG. 4C, uncured second sealing resin 22, which is a silicone resin that becomes harder than the first sealing resin 21 after being cured, is dropped on the first sealing resin 21 in order to perform potting. After the uncured second sealing resin 22 wets and spreads, the uncured second sealing resin 22 is stopped and kept by surface tension generated at a step between the second metal pattern 12 and the board 10 at the outer circumferential edge of the second metal pattern 12 and becomes a hemispherical shape. In this state, the second sealing resin 22 is cured.

The semiconductor device of this embodiment is manufactured by the processes described above.

In Embodiment 1, the first metal pattern 11 and the second metal pattern 12 are formed by performing electroplating such that electric current is supplied from the back surface side of the board 10 to both of the first metal pattern 11 and the second metal pattern 12 via the through electrode 13. Thus, a resin dam structure for stopping and keeping uncured sealing resins 21 and 22 in desired regions is formed by plating. The widths of the first metal pattern 11 and the second metal pattern 12, or in this embodiment, only the width of the second metal pattern 12, can be smaller than the diameter of the through electrode 13. It is also possible to form the through electrode 13 so as not to protrude outside the second metal pattern 12. These structures enable reduction in dimensions of the board 10 and thereby providing a small-sized semiconductor device.

In this embodiment, the through electrodes 13 and 16, which are made of copper cores that are formed by etching the copper sheet 201, have a high thermal conductivity. Thus, heat of the semiconductor element 17 is conducted to the back surface side of the board 10 and is dissipated efficiently.

In this embodiment, the plating layer 204a, in which the Ni layer and the Au layer are successively formed, covers the side surfaces as well as the upper surfaces of the Cu plating layer 203a and the Cu foil 10b, and the plating layer 204b, in which the Ni layer and the Au layer are successively formed, covers the side surfaces as well as the upper surfaces of the Cu plating layer 203b and the Cu foil 10c. Thus, the Cu plating layers 203a and 203b and the Cu foils 10b and 10c are not in contact with the first sealing resin 21 and the second sealing resin 22. This structure prevents corrosion of Cu, thereby improving reliability.

Embodiment 2

Figure 5B:
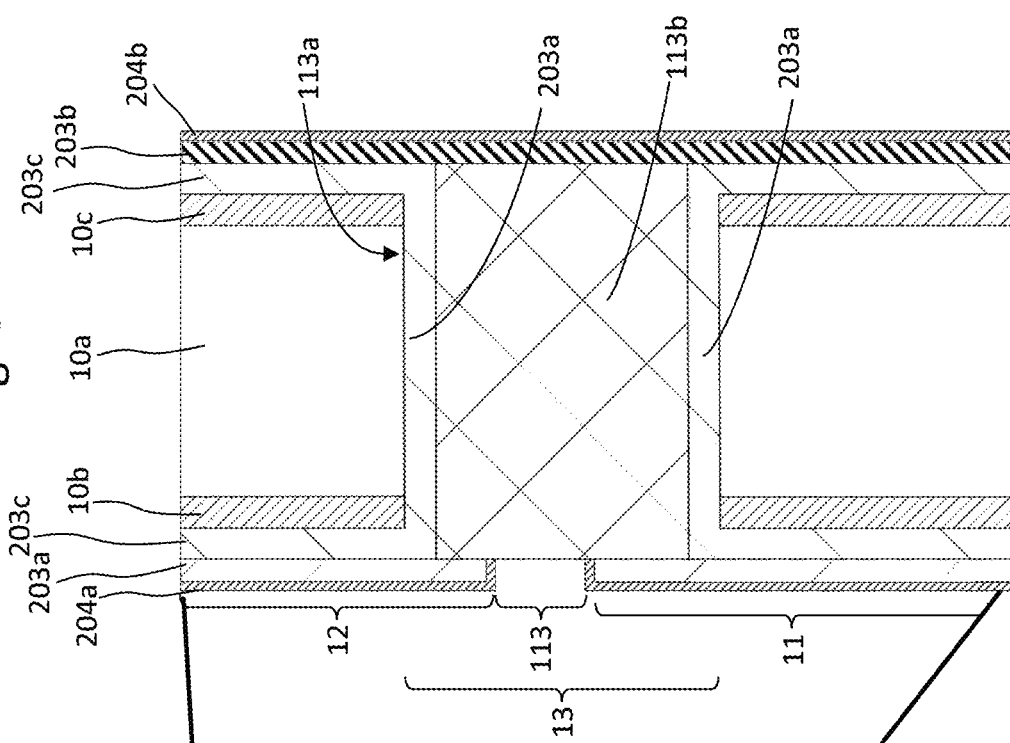
FIG. 5B is an enlarged sectional view in the vicinity of a through electrode 13.
Figure 5A:
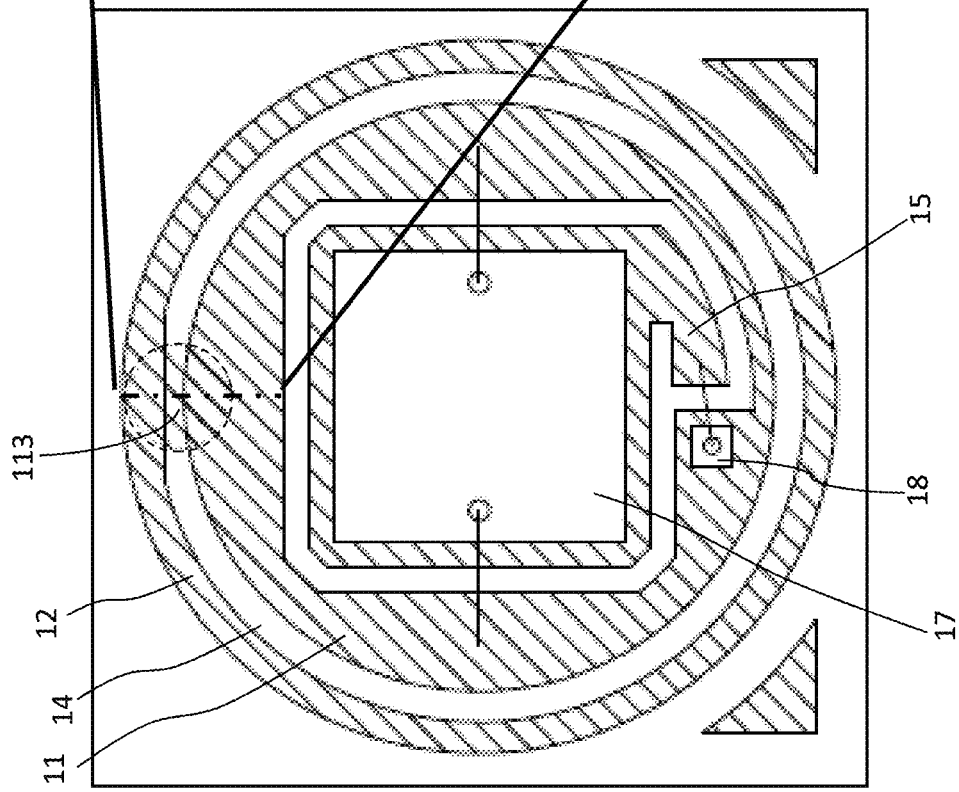
FIG. 5A is a top view of a semiconductor device of Embodiment 2.

A semiconductor device of Embodiment 2 will be described with reference to FIGS. 5A and 5B.

The semiconductor device of Embodiment 2 has a structure similar to that of the semiconductor device of Embodiment 1 but is different from the semiconductor device of Embodiment 1 in the following points. Instead of using a Cu core, the through electrode 13 uses a through hole structure in which a through hole 113a provided by, e.g. drilling, is filled with a resin 113b after its inner wall is covered with a Cu plating layer 203c, as illustrated in FIGS. 5A and 5B. The plating layer 204a covers a part of the upper surface of the through electrode 13. The Cu plating layer 203a is partially in contact with the upper surface of the through electrode 13, and in particular, the Cu plating layer 203a is in contact with the Cu plating layer 203c that is formed on the inner wall of the through hole 113a. That is, the first metal pattern 11 and the second metal pattern 12 are partially in contact with the through electrode 13.

The plating layer 204a and the Cu plating layer 203a are electrically connected to the Cu plating layer 203c that is formed on the inner wall of the through hole 113a. That is, the first metal pattern 11 and the second metal pattern 12 are electrically connected to the Cu plating layer 203c that is formed on the inner wall of the through hole 113a.

A groove 113 at which the resin 113b is exposed from the plating layer 204a is formed in the region between the first metal pattern 11 and the second metal pattern 12. The groove 113 can be formed as follows. For example, after the Cu plating layer 203a is formed to cover the upper surface of the through electrode 13, a corresponding region is partially removed by, e.g. etching, and the plating layer 204a is then formed by laminating a Au plating layer on a Ni plating layer.

Also in the semiconductor device of Embodiment 2, the through electrode 13 is electrically connected to the first metal pattern 11 and the second metal pattern 12 as in the case of Embodiment 1, whereby effects similar to those in Embodiment 1 are obtained.

Also in the semiconductor device of Embodiment 2, the groove 113 has an effect for stopping and keeping uncured first sealing resin 21 at an end of the first metal pattern 11 by a step relative to the groove 113, as in the case of Embodiment 1.

Embodiment 3

A semiconductor device of Embodiment 3 will be described with reference to FIGS. 6A and 6B.

The width of the groove 131 is narrowed in order to control the depth of the groove 131 to be formed in the through electrode 13 by etching in Embodiment 1. On the other hand, in this embodiment, a resist layer 61 is disposed instead of forming a groove, as illustrated in FIGS. 6A and 6B.

That is, the resist layer 61 is disposed only in the region in which the groove 131 is originally to be formed, after the process in FIG. 3C but before the process in FIG. 3D. Thereafter, the process in FIG. 3D and the subsequent processes are performed in a manner similar to that in Embodiment 1. As a result, the first metal pattern 11 and the second metal pattern 12 are formed so as to be separated from each other on the through electrode 13 by the resist layer 61, as illustrated in FIGS. 6A and 6B.

The structure in FIGS. 6A and 6B eliminates the need to control the depth of the groove 131, which is required in Embodiment 1, and reduces variations in shape of products.

The structure in FIGS. 6A and 6B also stops the first sealing resin 21 from wetting and spreading on the first metal pattern 11 because a step corresponding to the thicknesses of the plating layers 203a and 204a is formed at the outer circumferential edge of the first metal pattern 11.

Embodiment 4

A semiconductor device of Embodiment 4 will be described with reference to FIGS. 7A and 7B.

The semiconductor device of Embodiment 4 can have a structure similar to that of one of Embodiments 1 to 3 except for the vicinity of the through electrode 16.

Figure 7A:
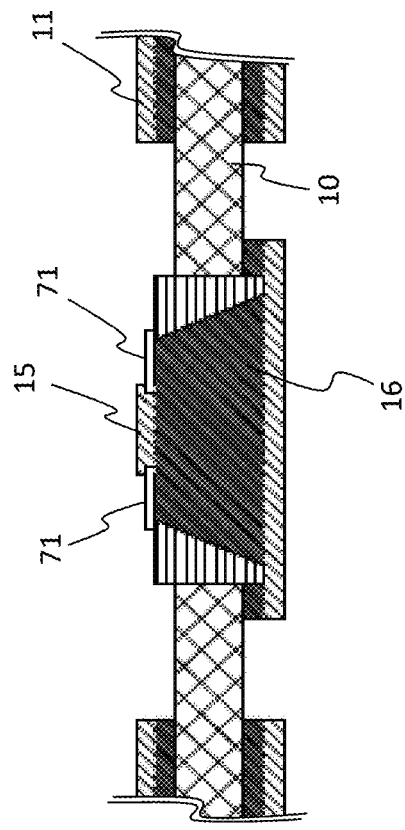
FIG. 7A is a sectional view of a board at the stage in which an element mounting electrode or a metal pattern 15 is formed in a process of manufacturing a semiconductor device of Embodiment 4.
Figure 7B:
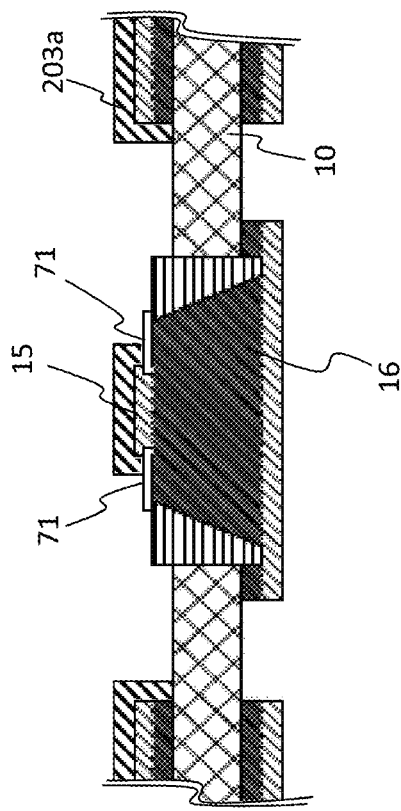
FIG. 7B is a sectional view of the board that is completed.

For this reason, only the vicinity of the through electrode 16 is illustrated in each of FIGS. 7A and 7B, and structures on right and left sides of the through electrode 16 are omitted.

FIG. 7A illustrates a state in which an element mounting metal pattern 15 that is hereinafter called an element mounting electrode is formed in a process of manufacturing the semiconductor device of Embodiment 4. FIG. 7B illustrates a state in which a board for mounting a semiconductor element 17 is completed.

The semiconductor device of Embodiment 4 can be used in combination with one of Embodiments 1 to 3.

The semiconductor device of Embodiment 4 includes a first metal pattern 11, a second metal pattern 12, and a through electrode 13, as in the semiconductor devices of Embodiments 1 to 3.

That is, as in Embodiments 1 to 3, a part of the first metal pattern 11 and a part of the second metal pattern 12 are disposed on the through electrode 13, and a plating layer 204a is provided to continuously cover the first metal pattern 11, the second metal pattern 12, and the through electrode 13. This structure enables providing a small-sized semiconductor device having the first metal pattern 11 and the second metal pattern 12 that are disposed in proximity to each other.

In the semiconductor device of Embodiment 4, the element mounting electrode 15 can have an area smaller than the through electrode 16 as desired, and the through electrode 16 can be made large accordingly.

Moreover, in the semiconductor device of Embodiment 4, when a semiconductor element 17 is fixed on the element mounting electrode 15 by a solder layer 172, the range of wetting and spreading of the solder layer 172 in a melt state is controlled to be approximately equal to the area of a bottom surface of the semiconductor element 17.

That is, in this semiconductor device, the through electrode 16 is larger than the semiconductor element 17, and the semiconductor element 17 is mounted, by using the solder layer 172 made of AuSn, on the element mounting electrode 15 with approximately the same size as the semiconductor element 17, which is a pattern for enabling self-alignment by tension of AuSn.

In these conditions, a resist layer 71 is disposed so as to cover a region exposed from the element mounting electrode 15 of the through electrode 16 as well as a boundary between the exposed region and the board 10.

This structure prevents the solder layer 172 in the melt state from wetting and spreading to the resist layer 71, whereby the semiconductor element 17 is exactly mounted on the element mounting electrode 15. Moreover, the through electrode 16 that is greater than the semiconductor element 17 is embedded in the board 10. Thus, heat of the semiconductor element 17 is sufficiently dissipated by the large through electrode 16.

A comparative example is illustrated in FIGS. 8A and 8B. In the comparative example, when a core, that is, a through electrode 16, is etched, the core 16 may be penetrated through by over-etching. Moreover, a board 10 using the core 16 has a structure, as illustrated in FIGS. 8A and 8B, in which the core 16 is made smaller than the semiconductor element 17 in order to exactly position the semiconductor element 17. This structure prevents efficient heat dissipation.

On the other hand, the structure of Embodiment 4 in FIGS. 7A and 7B enables good heat dissipation because the core, that is, the through electrode 16, can be enlarged.

The semiconductor device of Embodiment 4 can be manufactured by forming a resist layer 71 on the core, that is, the through electrode 16, as illustrated in FIGS. 7A and 7B, after the process in FIG. 3C but before the process in FIG. 3D in the process of manufacturing the semiconductor device of Embodiment 1. The resist layer 71 can be formed at the same time as formation of the resist layer 61 in the semiconductor device of Embodiment 3. Thereafter, the process in FIG. 3D and the subsequent processes are performed in a manner similar to that in Embodiment 1.

Embodiment 5

A semiconductor device of Embodiment 5 will be described with reference to FIGS. 9A to 9C.

The semiconductor device of Embodiment 5 is structured in such a manner as to control the area of wetting and spreading of uncured die-attaching agent or a solder layer 172 in a melt state in fixing a semiconductor element 17 on an element mounting electrode 15 by the die-attaching agent or the solder layer 172.

Figure 9B:
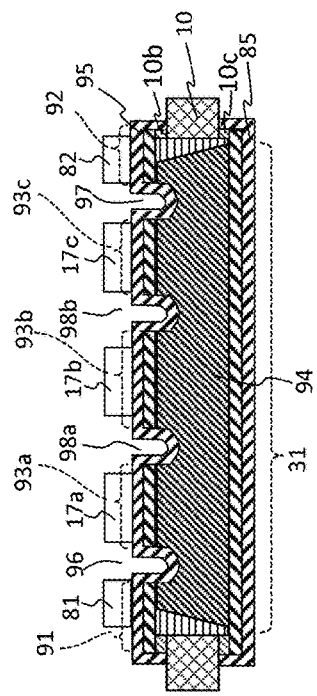
FIG. 9B is a sectional view.
Figure 9A:
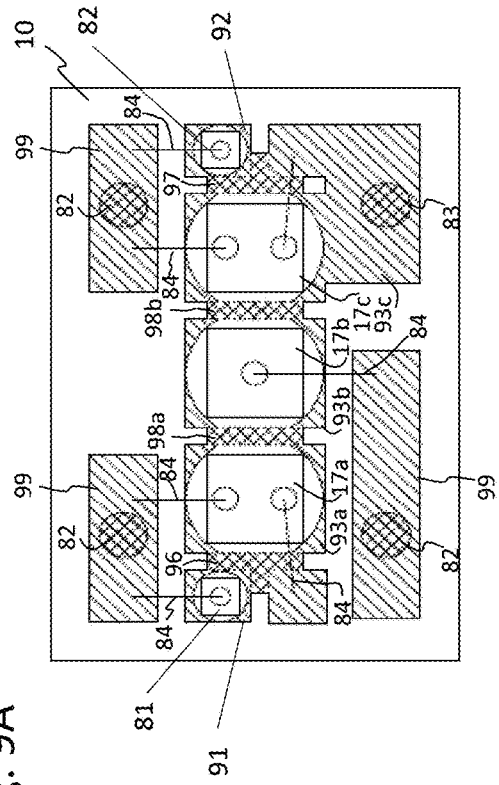
FIG. 9A is a top view of a semiconductor device of Embodiment 5.

As illustrated in FIGS. 9A and 9B, the semiconductor device of Embodiment 5 includes a board 10 that is mounted with three semiconductor elements 17a, 17b, and 17c and metal patterns 91, 92, and 93a to 93c that are formed on the board 10. The first metal pattern 91, the second metal pattern 92, and the third metal patterns 93a to 93c are disposed separately from each other on the board 10. A through electrode 94 that penetrates through the board 10 in the thickness direction is provided across the first metal pattern 91, the second metal pattern 92, and the third metal patterns 93a to 93c. The third metal patterns 93a to 93c that are mounted with the semiconductor elements 17a to 17c are disposed on the through electrode 94.

The first metal pattern 91, the second metal pattern 92, and the third metal patterns 93a to 93c are partially in contact with an upper surface of the through electrode 94.

A continuous plating layer 95 is disposed on the first metal pattern 91, the second metal pattern 92, the third metal patterns 93a to 93c, and the through electrode 94. The plating layer 95 electrically connects the first metal pattern 91, the second metal pattern 92, and the through electrode 94 to each other.

A groove 96 in adjacent to the first metal pattern 91 and a groove 97 in adjacent to the second metal pattern 92 are disposed on the upper surface of the through electrode 94. Inner walls of the grooves 96 and 97 are covered with the plating layer 95.

Thus, although die-attaching agent or a solder layer is used in mounting the semiconductor elements 17a to 17c on the plating layer 95 on the metal patterns 93a to 93c positioned between the grooves 96 and 97, the die-attaching agent or the solder layer in a melt state is stopped and kept by surface tension generated at steps of the grooves 96 and 97. This prevents the die-attaching agent or the solder layer in the melt state from flowing onto the first metal pattern 91 and the second metal pattern 92 and enables disposing the first metal pattern 91 and the second metal pattern 92 close to the third metal patterns 93a to 93c.

For example, the board 10 is made of a glass epoxy board, the first metal pattern 91 and the second metal pattern 92 have a lamination structure of a Cu plating layer on a Cu foil, and the plating layer 95 has a lamination structure of a Ni plating layer and a Au plating layer.

Also in the case of mounting the semiconductor element 17a on the plating layer 95 on the third metal pattern 93a by using die-attaching agent or solder, the die-attaching agent or the solder does not spread onto the first metal pattern 91 and the third metal pattern 93b, thereby not contaminating them. This does not prevent bonding of a power supplying wiring 84 for electrically connecting the semiconductor element 17a and the first metal pattern 91 to each other.

Also in a case of respectively fixing Zener diodes 81 and 82 on the first metal pattern 91 and the second metal pattern 92 by using die-attaching agent or a solder layer, the steps at the grooves 96 and 97 stop and keep the die-attaching agent in an uncured state or the solder layer in a melt state at edges of the first metal pattern 91 and the second metal pattern 92. This enables disposing the semiconductor elements 17a to 17c and the Zener diodes 81 and 82 in proximity to each other. Thus, a small-sized semiconductor device is provided.

In this case, a back surface electrode 85 that is coupled to the through electrode 94 is disposed on a back surface of the board 10. Potentials having the same polarity are supplied from the back surface electrode 85 to the first metal patterns 91, the second metal pattern 92, and the third metal patterns 93a to 93c via the through electrode 94.

Moreover, a groove 98a is formed between the semiconductor elements 17a and 17b, and a groove 98b is formed between the semiconductor elements 17b and 17c. This prevents die-attaching agent or a solder layer in a melt state of each of the semiconductor elements 17a to 17c from reaching the respective adjacent element, thereby enabling disposing the semiconductor elements 17a to 17c in proximity to each other.

In addition, one or more (here three) metal patterns 99 that are electrodes having polarity inverse to the polarity of the first metal pattern 91, the second metal pattern 92, and the third metal patterns 93a to 93c may be disposed around them and may be coupled to the semiconductor elements 17a to 17c and the Zener diodes 81 and 82 by bonding wires 84. In this case, a through electrode 82 is provided immediately under the metal pattern 99, and a potential is supplied to the metal pattern 99 from the back surface electrode 86, which is disposed on the back surface of the board 10. This structure enables reduction in dimensions of the board 10.

An auxiliary through electrode 83 may also be disposed under the third metal pattern 93c, as illustrated in FIG. 9A.

Figure 9C:
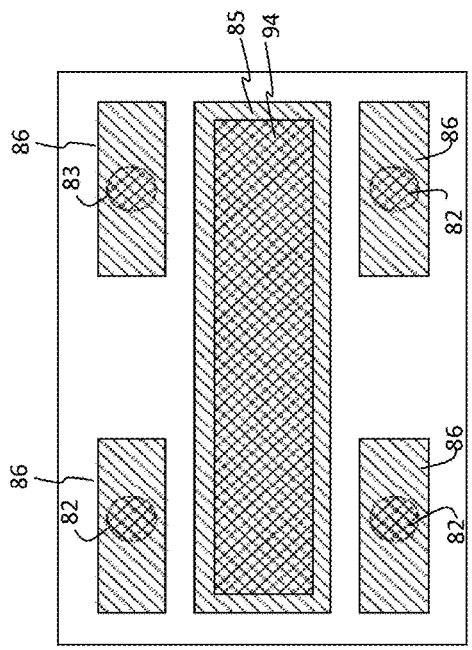
FIG. 9C is a bottom view.
Figure 10B:
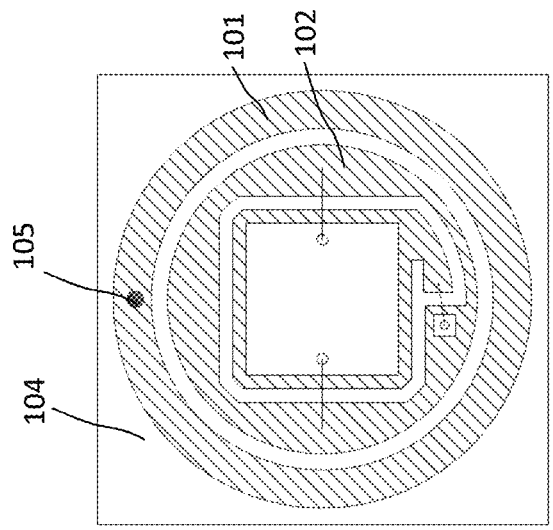
FIG. 10B is a top view of a semiconductor device having a through electrode or via for supplying electric current in plating.
Figure 10A:
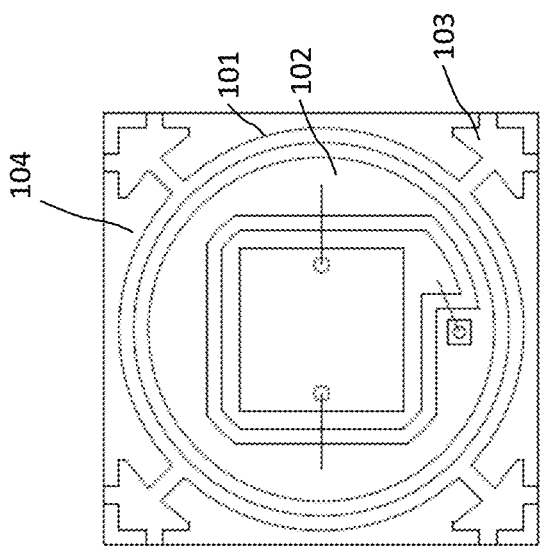
FIG. 10A is a top view of a conventional semiconductor device having a power supplying wiring for plating on a surface of a board.

The semiconductor device of this embodiment in FIGS. 9A to 9C can be manufactured by a process similar to the manufacturing process of Embodiment 1 in FIGS. 3A to 4C. In this case, the grooves 96, 97, 98a, and 98b are formed so as to have appropriate depths in the process in FIG. 3E.

The semiconductor device of each of the foregoing embodiments can be used as, e.g., an LED lighting device.

What is claimed is:

1. A semiconductor device comprising:
a board mounted with a semiconductor element; and
metal patterns formed on the board, wherein
the metal patterns include a first metal pattern, a second metal pattern, and a through electrode, the first metal pattern and the second metal pattern are provided separately from each other on the board, the through electrode is disposed between the first metal pattern and the second metal pattern and penetrates through the board in the thickness direction,
the first metal pattern and the second metal pattern are partially in contact with an upper surface of the through electrode, and the first metal pattern, the second metal pattern, and the through electrode are in electric contact with each other,
a continuous plating layer is disposed on the first metal pattern, the second metal pattern, and the through electrode, and the first metal pattern, the second metal pattern, and the through electrode are in electric contact with each other by the plating layer.

2. The semiconductor device according to claim 1, wherein the first metal pattern is formed into a shape surrounding the semiconductor element, and the second metal pattern is formed into a shape surrounding the first metal pattern.

3. The semiconductor device according to claim 1, wherein the through electrode between the first metal pattern and the second metal pattern is provided with a groove, and the plating layer also covers an inner wall of the groove.

4. The semiconductor device according to claim 3, wherein the first metal pattern is formed into a shape surrounding the semiconductor element, and the second metal pattern is formed into a shape surrounding the first metal pattern.

5. The semiconductor device according to claim 3, wherein the groove has a width that is narrower than a space between the first metal pattern and the second metal pattern in a region in which the through electrode is not disposed.

6. The semiconductor device according to claim 5, wherein the first metal pattern is formed into a shape surrounding the semiconductor element, and the second metal pattern is formed into a shape surrounding the first metal pattern.

7. A semiconductor device comprising:
a board mounted with a semiconductor element; and
metal patterns formed on the board, wherein
the metal patterns include a first metal pattern, a second metal pattern, and a through electrode, the first metal pattern and the second metal pattern are provided separately from each other on the board, the through electrode is disposed between the first metal pattern and the second metal pattern and penetrates through the board in the thickness direction,
the first metal pattern and the second metal pattern are partially in contact with an upper surface of the through electrode, and the first metal pattern, the second metal pattern, and the through electrode are in electric contact with each other,
a resist layer is formed on the through electrode between the first metal pattern and the second metal pattern.

8. The semiconductor device according to claim 7, wherein the first metal pattern is formed into a shape surrounding the semiconductor element, and the second metal pattern is formed into a shape surrounding the first metal pattern.

9. A semiconductor device comprising:
a board mounted with a semiconductor element; and
metal patterns formed on the board, wherein
the metal patterns include a first metal pattern, a second metal pattern, and a through electrode, the first metal pattern and the second metal pattern are provided separately from each other on the board, the through electrode is disposed between the first metal pattern and the second metal pattern and penetrates through the board in the thickness direction,
the first metal pattern and the second metal pattern are partially in contact with an upper surface of the through electrode, and the first metal pattern, the second metal pattern, and the through electrode are in electric contact with each other,
the first metal pattern is formed into a shape surrounding the semiconductor element, and the second metal pattern is formed into a shape surrounding the first metal pattern.

10. The semiconductor device according to claim 9, further comprising:
a first sealing resin for sealing a region inside an outer circumferential edge of the first metal pattern on the board; and
a second sealing resin for sealing a region inside an outer circumferential edge of the second metal pattern.

11. The semiconductor device according to claim 10, wherein each of the first metal pattern and the second metal pattern includes a Cu layer, and the plating layer covers an upper surface and a side surface of the Cu layer.

12. A method for manufacturing a semiconductor device, comprising:
forming a metal layer on the entirety of a surface of a board having a through electrode that penetrates through the board in the thickness direction;
etching the metal layer into shapes of a first metal pattern and a second metal pattern that are separated from each other at a predetermined space on the through electrode and that are in contact with the through electrode, while forming a groove at an upper part of the through electrode under the space between the first metal pattern and the second metal pattern; and
supplying electric current from a back surface side of the board to both of the first metal pattern and the second metal pattern via the through electrode at the same time, thereby forming a plating layer that covers upper surfaces of the first metal pattern and the second metal pattern and an inner wall of the groove, by electroplating.

13. A semiconductor device comprising:
a board mounted with a semiconductor element; and
metal patterns formed on the board, wherein
the metal patterns include a first metal pattern, a second metal pattern, and a through electrode, the first metal pattern and the second metal pattern are provided separately from each other on the board, the through electrode is disposed between the first metal pattern and the second metal pattern and penetrates through the board in the thickness direction,
the first metal pattern and the second metal pattern are partially in contact with an upper surface of the through electrode, and the first metal pattern, the second metal pattern, and the through electrode are in electric contact with each other, and the through electrode between the first metal pattern and the second metal pattern is provided with a groove.

\* \* \* \* \*